(12) United States Patent
Kobayashi et al.

(10) Patent No.: US 11,978,621 B2
(45) Date of Patent: May 7, 2024

(54) TEMPERATURE ADJUSTMENT DEVICE WITH SPACERS

(71) Applicant: KELK Ltd., Kanagawa (JP)

(72) Inventors: Atsushi Kobayashi, Kanagawa (JP); Hideaki Ohkubo, Kanagawa (JP)

(73) Assignee: KELK Ltd., Kanagawa (JP)

( * ) Notice: Subject to any disclaimer, the term of this patent is extended or adjusted under 35 U.S.C. 154(b) by 436 days.

(21) Appl. No.: 17/292,834

(22) PCT Filed: Oct. 30, 2019

(86) PCT No.: PCT/JP2019/042605
§ 371 (c)(1),
(2) Date: May 11, 2021

(87) PCT Pub. No.: WO2020/100596
PCT Pub. Date: May 22, 2020

(65) Prior Publication Data
US 2021/0398799 A1  Dec. 23, 2021

(30) Foreign Application Priority Data
Nov. 15, 2018  (JP) .................. 2018-214947

(51) Int. Cl.
*H01L 21/00* (2006.01)
*H01L 21/02* (2006.01)
*H01L 21/67* (2006.01)

(52) U.S. Cl.
CPC .. *H01L 21/02052* (2013.01); *H01L 21/67051* (2013.01); *H01L 21/67103* (2013.01); *H01L 21/67248* (2013.01)

(58) Field of Classification Search
CPC ......... H01L 21/02052; H01L 21/67051; H01L 21/67103; H01L 21/67248; H01L 23/38;
(Continued)

(56) References Cited

U.S. PATENT DOCUMENTS 6,392,205 B1 * 5/2002 Minonishi ......... H01L 21/67248
219/443.1
6,912,357 B2  6/2005 Bissonnette et al.
(Continued)

FOREIGN PATENT DOCUMENTS

CN  101275776 A  10/2008
JP  H07-297453 A  11/1995
(Continued)

OTHER PUBLICATIONS

PCT International Search Report in International Application No. PCT/JP2019/042605, dated Dec. 24, 2019, 2 pages.

*Primary Examiner* — Travis Ruby
(74) *Attorney, Agent, or Firm* — Fish & Richardson P.C.

(57) ABSTRACT

A temperature adjustment device includes: a pair of flow path plates, each of the pair of flow path plates including a flow path groove provided on a front surface of the each of the pair of flow path plates and at least a part of the front surface; a spacer member that includes a support surface projecting from the front surface, and connects the pair of flow path plates such that a back surface of one of the pair of flow path plates and a back surface of the other of the pair of flow path plate face each other; and a heat transfer plate that faces the flow path groove, and is supported by the support surface.

11 Claims, 6 Drawing Sheets

(58) Field of Classification Search
CPC .............. H01L 23/4006; H01L 23/473; H01L 2023/4056; H01L 2023/4081
See application file for complete search history.

(56) References Cited

U.S. PATENT DOCUMENTS

| | | | |
|---|---|---|---|
| 7,938,577 | B2 | 5/2011 | Takahashi |
| 8,522,861 | B2* | 9/2013 | Zaffetti ................ H01L 23/473 165/80.4 |
| 9,003,649 | B1* | 4/2015 | Romero ............... B23K 20/127 29/830 |
| 2003/0172657 | A1 | 9/2003 | Ohkubo et al. |
| 2011/0299244 | A1* | 12/2011 | Dede ....................... F28F 3/046 361/689 |
| 2011/0317368 | A1* | 12/2011 | Pautsch ................ H01L 23/473 361/702 |
| 2018/0082925 | A1* | 3/2018 | Grassmann ............. H01L 23/42 |

FOREIGN PATENT DOCUMENTS

| | | |
|---|---|---|
| JP | H09-105596 | 4/1997 |
| JP | 2003-337626 A | 11/2003 |
| JP | 2004-003817 | 1/2004 |
| JP | 2005-516173 | 6/2005 |
| JP | 2008-186913 | 8/2008 |
| JP | 2009-115345 | 5/2009 |
| JP | 2010-151427 | 7/2010 |
| JP | 2010-159939 | 7/2010 |
| KR | 10-2018-0015503 A | 2/2018 |

* cited by examiner

TEMPERATURE ADJUSTMENT DEVICE WITH SPACERS

CROSS-REFERENCE TO RELATED APPLICATIONS

This application is a National Stage application of International Application No. PCT/JP2019/042605, filed on Oct. 30, 2019, which claims priority to Japanese Patent Application No. 2018-214947, filed on Nov. 15, 2018. The contents of the prior applications are incorporated herein in their entirety.

FIELD

The present invention relates to a temperature adjustment device.

BACKGROUND

A semiconductor device is manufactured through a plurality of processes of a cleaning process of cleaning a semiconductor wafer, an applying process of applying a photoresist to the semiconductor wafer, an exposing process of exposing the semiconductor wafer to which the photoresist is applied, and an etching process of etching the exposed semiconductor wafer. In the cleaning process of the semiconductor wafer, the semiconductor wafer is cleaned with a temperature-adjusted liquid. Patent Literature 1 discloses an example of a fluid temperature adjustment device that adjusts a temperature of a liquid.

CITATION LIST

Patent Literature

Patent Literature 1: JP 2008-186913 A

SUMMARY

Technical Problem

When the temperature adjustment device is configured of a plurality of members, it is preferable that an assembly work is easy and the relative position of the plurality of members can be maintained.

An aspect of the present invention aims to make the assembly work easy, and maintain the relative position of the plurality of members when the temperature adjustment device is configured of a plurality of members.

Solution to Problem

According to an aspect of the present invention, a temperature adjustment device comprises: a pair of flow path plates, each of the pair of flow path plates including a flow path groove provided on a front surface of the each of the pair of flow path plates and at least a part of the front surface; a spacer member that includes a support surface projecting from the front surface, and connects the pair of flow path plates such that a back surface of one of the pair of flow path plates and a back surface of the other of the pair of flow path plate face each other; and a heat transfer plate that faces the flow path groove, and is supported by the support surface.

Advantageous Effects of Invention

According to an aspect of the present invention, when the temperature adjustment device is configured of the plurality of members, the assembly work is easy and the relative position of the plurality of members can be maintained.

DESCRIPTION OF EMBODIMENTS

Hereinafter, embodiments according to the present invention will be described with reference to the drawings, but the present invention is not limited thereto. Components of the embodiments, which will be described below, can be combined appropriately. Some components may not be used.

In the following description, an XYZ orthogonal coordinate system is set, and a positional relationship of each part will be described with reference to the XYZ orthogonal coordinate system. A direction parallel to an X-axis in a predetermined plane is an X-axis direction. A direction parallel to a Y-axis orthogonal to the X-axis in the predetermined plane is a Y-axis direction. A direction parallel to a Z-axis orthogonal to the predetermined plane is a Z-axis direction. An XY plane including the X-axis and Y-axis is parallel to the predetermined plane. An YZ plane including the Y-axis and Z-axis is orthogonal to the XY plane. An XZ plane including the X-axis and Z-axis is orthogonal to the XY plane and YZ plane respectively. In the embodiment, the XY plane is parallel to a horizontal plane. The Z-axis direction is a vertical direction. A +Z direction (a +Z side) is an upper direction (an upper side). A −Z direction (a −Z side) is a lower direction (a lower side). The XY plane may be inclined with respect to the horizontal plane.

First Embodiment

<Cleaning System>

Figure 1:
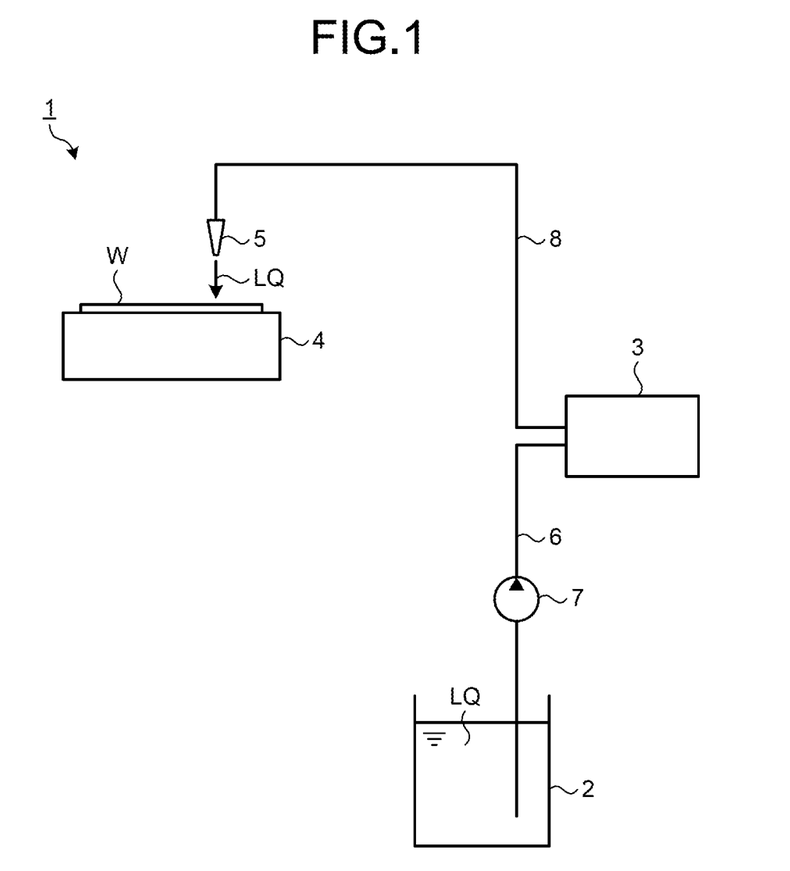
FIG. 1 is a diagram schematically illustrating an example of a cleaning system according to a first embodiment.

The first embodiment will be described. FIG. 1 is a diagram schematically illustrating an example of a cleaning system 1 according to the embodiment. The cleaning system 1 cleans a substrate W which is a cleaning target by using a cleaning liquid LQ. The substrate W includes, for example, a semiconductor wafer. The liquid LQ may be pure water or a chemical solution. As the chemical solution, at least one of an ammonia hydrogen peroxide mixture and a hydrochloric acid hydrogen peroxide mixture is exemplified.

The cleaning system 1 includes a storage tank 2 that stores the liquid LQ, a temperature adjustment device 3 that adjusts a temperature of the liquid LQ supplied from the storage tank 2, a substrate holding member 4 that holds the substrate W, a nozzle 5 that supplies the liquid LQ of which the temperature is adjusted by the temperature adjustment device 3 to the substrate W, a first connection pipe 6 that connects the storage tank 2 and the temperature adjustment device 3, a pump 7 that is disposed in the first connection pipe 6, and a second connection pipe 8 that connects the temperature adjustment device 3 and the nozzle 5.

The storage tank 2 stores the liquid LQ. When the pump 7 is driven, at least a part of the liquid LQ stored in the storage tank 2 is supplied to the temperature adjustment device 3 via the first connection pipe 6.

The temperature adjustment device 3 adjusts the temperature of the liquid LQ. The liquid LQ of which the temperature is adjusted by the temperature adjustment device 3 is supplied to the nozzle 5 via the second connection pipe 8. The nozzle 5 supplies the liquid LQ to the substrate W. The substrate W is cleaned by supplying the liquid LQ to the substrate W.

<Temperature Adjustment Device>

Figure 2:
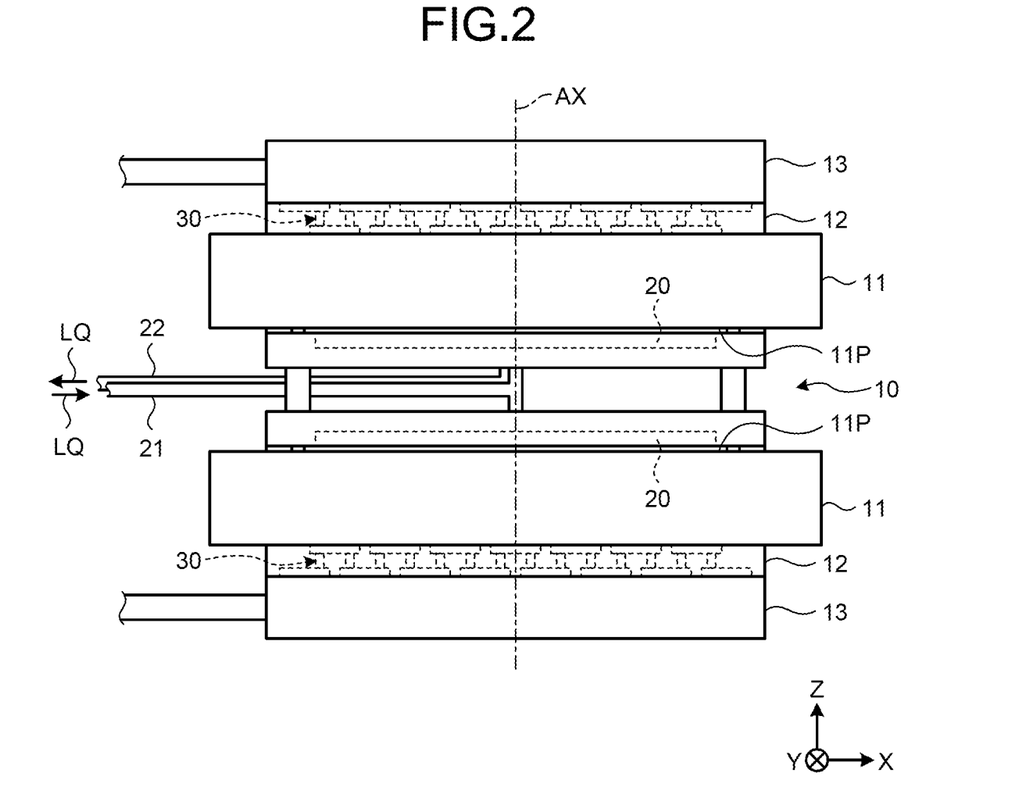
FIG. 2 is a side view schematically illustrating an example of a temperature adjustment device according to the first embodiment.

FIG. 2 is a side view schematically illustrating an example of a temperature adjustment device 3 according to the embodiment. As illustrated in FIG. 2, the temperature adjustment device 3 includes a main body 10, a pair of heat transfer plates 11 connected to an upper surface and a lower surface of the main body 10 respectively via a corrosion resistant plate 11P, a thermoelectric module plate 12 connected to each of one heat transfer plate 11 and the other heat transfer plate 11, and a pair of heat exchange plates 13 connected to each of one thermoelectric module plate 12 and the other thermoelectric module plate 12.

The main body 10 includes a flow path 20 through which the liquid LQ flows. The flow path 20 is provided on each of the upper surface and the lower surface of the main body 10. The flow path 20 faces the heat transfer plate 11. The main body 10 is formed of polytetrafluoroethylene (PTFE), a perfluoroalkoxy alkane (PFA) resin, or polyvinylidene difluoride (PVDF).

The flow path 20 is connected to a supply pipe 21. The supply pipe 21 is formed of PTFE or PFA. The liquid LQ supplied to the flow path 20 flows through the supply pipe 21. The supply pipe 21 is connected to the storage tank 2 via the first connection pipe 6. The liquid LQ of the storage tank 2 is supplied to the flow path 20 via the supply pipe 21.

The flow path 20 is connected to a discharge pipe 22. The discharge pipe 22 is formed of PTFE or PFA. The liquid LQ flowing through the flow path 20 is discharged to the discharge pipe 22. The liquid LQ discharged from the flow path 20 flows through the discharge pipe 22. The discharge pipe 22 is connected to the nozzle 5 via the second connection pipe 8. The liquid LQ of which the temperature is adjusted by the temperature adjustment device 3 is supplied to the nozzle 5 via the discharge pipe 22.

The corrosion resistant plate 11P includes, for example, an amorphous carbon. The corrosion resistant plate 11P has corrosion resistance to an acidic liquid LQ. The corrosion resistant plate 11P has thermal conductivity.

The heat transfer plate 11 exchanges heat with the liquid LQ flowing through the flow path 20 via the corrosion resistant plate 11P. The heat transfer plate 11 includes one heat transfer plate 11 facing the upper surface of the main body 10 and the other heat transfer plate 11 facing the lower surface of the main body 10. The heat transfer plate 11 is formed of, for example, aluminum.

The thermoelectric module plate 12 absorbs or generates heat to adjust the temperature of the liquid LQ flowing through the flow path 20. The thermoelectric module plate 12 includes one thermoelectric module plate 12 connected to the upper surface of one heat transfer plate 11, and the other thermoelectric module plate 12 connected to the lower surface of the other heat transfer plate 11. The thermoelectric module plate 12 includes a thermoelectric module 30 that absorbs or generates heat by supplying electric power. The thermoelectric module 30 absorbs or generates heat due to a Peltier effect.

The thermoelectric module 30 can take heat from the liquid LQ flowing through the flow path 20 via the heat transfer plate 11. The thermoelectric module 30 can give heat from the liquid LQ flowing through the flow path 20 via the heat transfer plate 11. The thermoelectric module 30 absorbs or generates heat to adjust the temperature of the liquid LQ flowing through the flow path 20.

The heat exchange plate 13 exchanges heat with the thermoelectric module plate 12. The heat exchange plate 13 includes one heat exchange plate 13 connected to the upper surface of one thermoelectric module plate 12, and the other heat exchange plate 13 connected to the lower surface of the other thermoelectric module plate 12. The heat exchange plate 13 has an internal flow path (not shown) through which a temperature adjustment fluid flows. The temperature adjustment fluid flows into the internal flow path through the inlet of the internal flow path after the temperature of the temperature adjustment fluid is adjusted by a fluid temperature adjustment device (not shown). The temperature adjustment fluid flows through the internal flow path to take heat from the heat exchange plate 13 or give heat to the heat exchange plate 13. The temperature adjustment fluid flows out from the outlet of the internal flow path, and is returned to the fluid temperature adjustment device.

In the embodiment, each of the main body 10, the heat transfer plate 11, the thermoelectric module plate 12, and the heat exchange plate 13 has substantially a disk shape. In the following description, a virtual axis that passes through the center of each of the main body 10, the heat transfer plate 11, the thermoelectric module plate 12, and the heat exchange plate 13 and is parallel to the Z-axis is appropriately referred to as a central axis AX.

<Thermoelectric Module>

Figure 3:
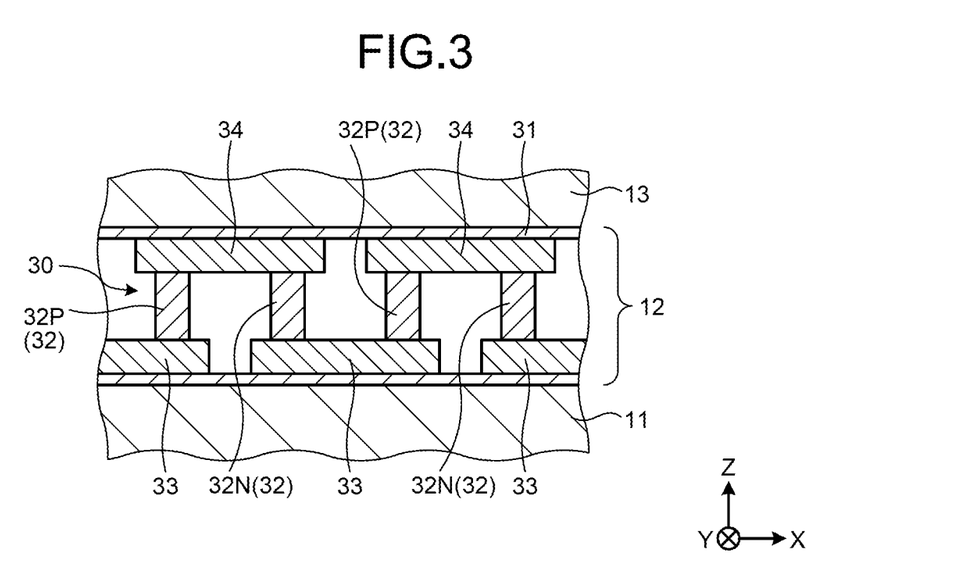
FIG. 3 is an enlarged cross-sectional view of a part of a thermoelectric module plate according to the first embodiment.

FIG. 3 is an enlarged cross-sectional view of a part of the thermoelectric module plate 12 according to the embodiment. As illustrated in FIG. 3, the thermoelectric module plate 12 includes a plurality of the thermoelectric modules 30, and a case 31 that accommodates a plurality of the thermoelectric modules 30. The case 31 is formed of an insulating material.

The thermoelectric module 30 includes a thermoelectric semiconductor element 32, a first electrode 33, and a second electrode 34. The thermoelectric semiconductor element 32 includes a p-type thermoelectric semiconductor element 32P, and an n-type thermoelectric semiconductor element 32N. In the XY plane, the p-type thermoelectric semiconductor element 32P, and the n-type thermoelectric semiconductor element 32N are arranged alternately. The first electrode 33 is connected to each of the p-type thermoelectric semiconductor element 32P, and the n-type thermoelectric semiconductor element 32N. The second electrode 34 is connected to each of the p-type thermoelectric semiconductor element 32P, and the n-type thermoelectric semiconductor element 32N. The first electrode 33 is adjacent to the heat transfer plate 11. The second electrode 34 is adjacent to the heat exchange plate 13. Each of one end face of the p-type thermoelectric semiconductor element 32P, and one end face of the n-type thermoelectric semiconductor element 32N is connected to the first electrode 33. Each of the other end face of the p-type thermoelectric semiconductor element 32P, and the other end face of the n-type thermoelectric semiconductor element 32N is connected to the second electrode 34.

The thermoelectric module 30 absorbs or generates heat due to a Peltier effect. When a potential difference is applied between the first electrode 33 and the second electrode 34, electric charges move in the thermoelectric semiconductor element 32. Due to the movement of the electric charges, heat is transferred in the thermoelectric semiconductor element 32. As a result, the thermoelectric module 30 absorbs or generates the heat. For example, when the potential difference is applied between the first electrode 33 and the second electrode 34 so that the first electrode 33 generates heat and the second electrode 34 absorbs heat, the liquid LQ flowing through the flow path 20 is heated. When the potential difference is applied between the first electrode 33 and the second electrode 34 so that the first electrode 33 absorbs heat and the second electrode 34 generates heat, the liquid LQ flowing through the flow path 20 is cooled.

<Main Body>

Figure 4:
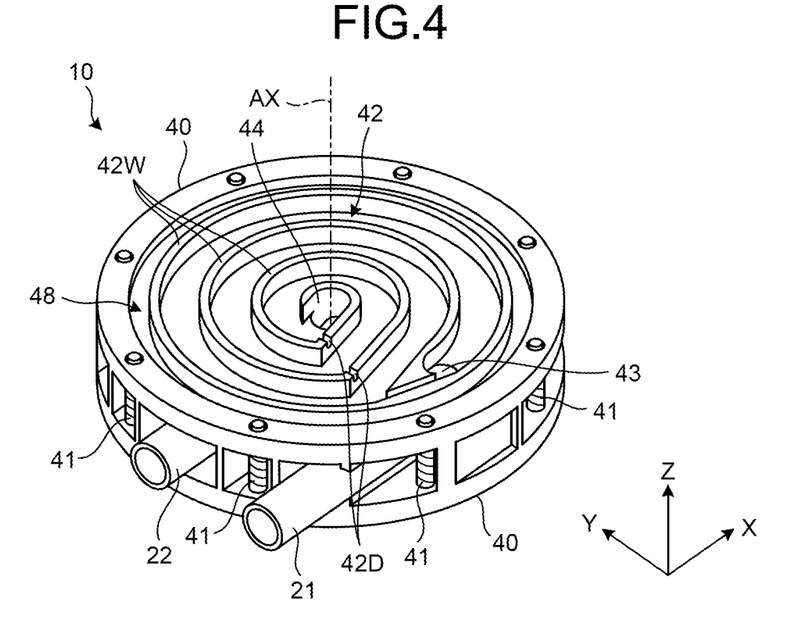
FIG. 4 is a perspective view illustrating an example of a main body of the temperature adjustment device according to the first embodiment.
Figure 5:
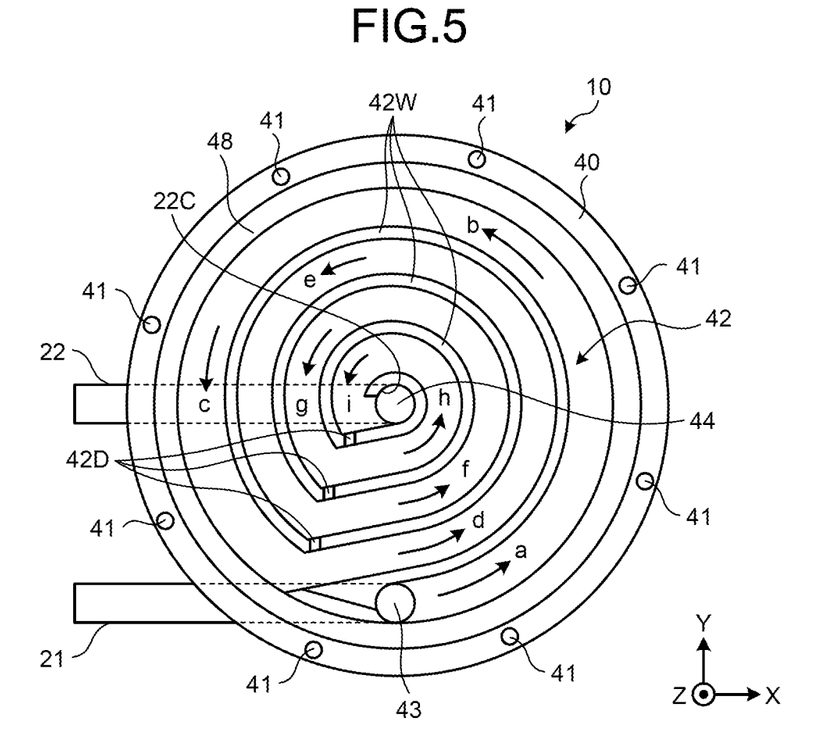
FIG. 5 is a plan view illustrating an example of the main body of the temperature adjustment device according to the first embodiment.
Figure 6:
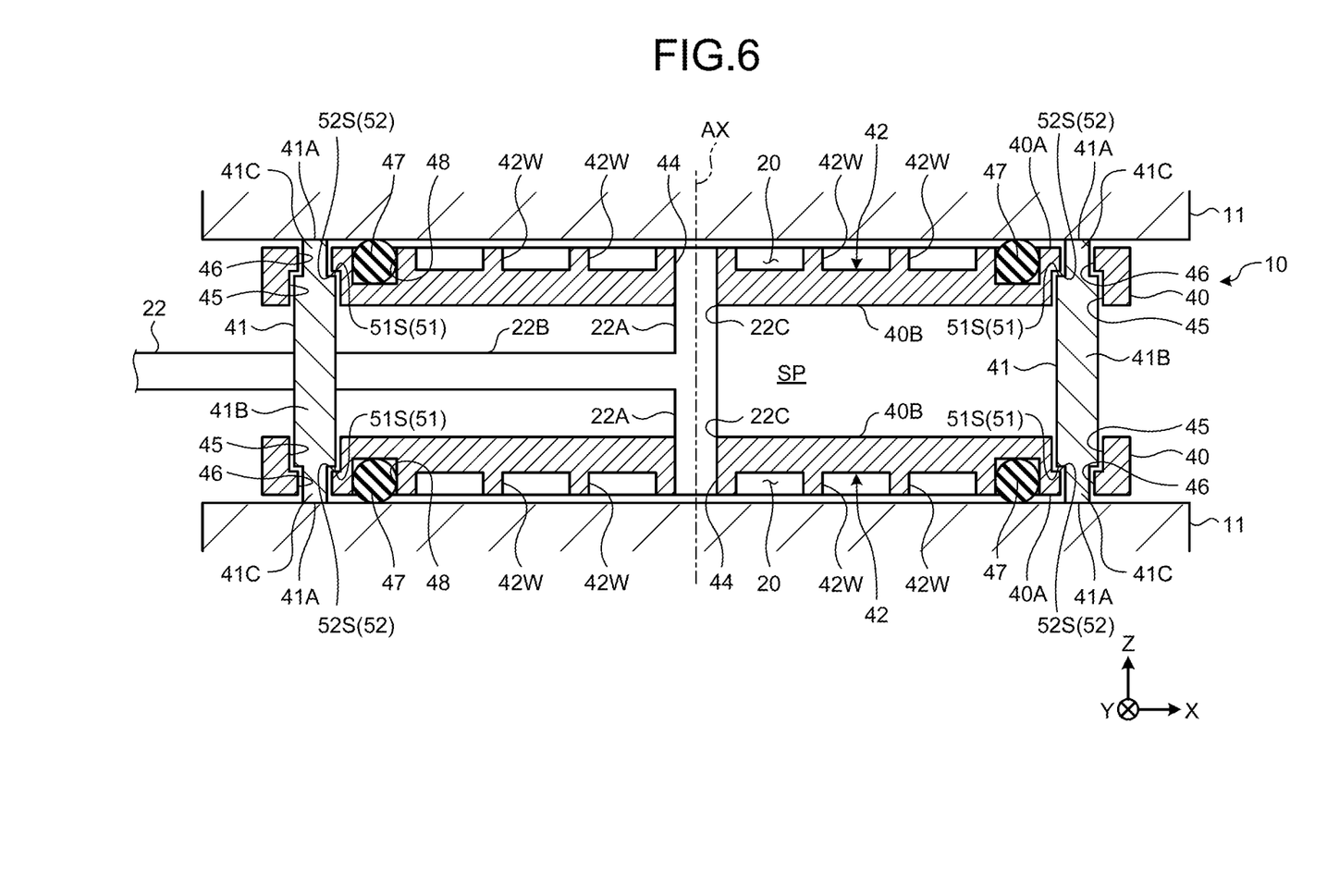
FIG. 6 is a cross-sectional view illustrating an example of the main body of the temperature adjustment device according to the first embodiment.

FIG. 4 is a perspective view illustrating an example of a main body 10 of a temperature adjustment device 3 according to the embodiment. FIG. 5 is a plan view illustrating an example of the main body 10 of the temperature adjustment device 3 according to the embodiment. FIG. 6 is a cross-sectional view illustrating an example of the main body 10 of the temperature adjustment device 3 according to the embodiment.

As illustrated in FIGS. 4, 5, and 6, the main body 10 includes a pair of flow path plates 40 having a front surface 40A and a back surface 40B respectively, and a spacer member 41 connecting a pair of the flow path plates 40. One flow path plate 40 faces one heat transfer plate 11. The other flow path plate 40 faces the other heat transfer plate 11. The spacer member 41 connects a pair of the flow path plates 40 so that the back surface 40B of one flow path plate 40 and the back surface 40B of the other flow path plate 40 face each other via a space SP.

One flow path plate 40 and the other flow path plate 40 have the same structure. Hereinafter, one flow path plate 40 will be mainly described, and the description of the other flow path plate 40 will be simplified or omitted.

The flow path plate 40 has a flow path groove 42 provided in at least a part of the front surface 40A. The flow path groove 42 is defined by a partition wall 42W. The flow path groove 42 is defined between a pair of the partition walls 42W. The heat transfer plate 11 faces the flow path groove 42. In a state in which the heat transfer plate 11 faces the flow path groove 42, an end face of the partition wall 42W is in contact with the heat transfer plate 11. The flow path groove 42 is covered by the heat transfer plate 11, and the flow path 20 is formed by the contact between the end face of the partition wall 42W and the heat transfer plate 11.

The flow path plate 40 includes a fluid supply port 43 for supplying the liquid LQ to the flow path groove 42, and a fluid discharge port 44 for discharging at least a part of the liquid LQ in the flow path groove 42. At least a part of the fluid discharge port 44 is disposed on the central axis AX of the flow path plate 40. The fluid supply port 43 is disposed outside of the fluid discharge port 44 in a radial direction of the central axis AX. The flow path groove 42 is provided in a spiral shape so as to connect the fluid supply port 43 and the fluid discharge port 44.

The partition wall 42W is provided in a spiral shape. A recess 42D connecting adjacent flow path grooves 42 is provided in a part of the partition wall 42W. The recess 42D is formed by cutting out a part of the end face of the partition wall 42W.

The main body 10 includes the supply pipe 21 through which the liquid LQ supplied to the flow path groove 42 flows, and the discharge pipe 22 through which the liquid LQ discharged from the flow path groove 42 flows. At least a part of the supply pipe 21 is disposed in the space SP between one flow path plate 40 and the other flow path plate 40. At least a part of the discharge pipe 22 is disposed in the space SP between one flow path plate 40 and the other flow path plate 40.

The supply pipe 21 includes a collection pipe and a branch pipe connected to each of the fluid supply port 43 of one flow path plate 40 and the fluid supply port 43 of the other flow path plate 40. An outlet of the branch pipe and the fluid supply port 43 are connected.

As illustrated in FIG. 6, the discharge pipe 22 includes a branch pipe 22A connected to each of the fluid discharge port 44 of one flow path plate 40 and the fluid discharge port 44 of the other flow path plate 40, and a collection pipe 22B connected to a pair of branch pipes 22A. An inflow port 22C of the branch pipe 22A and the fluid discharge port 44 are connected to each other. At least a part of the inflow port 22C of the discharge pipe 22 (the branch pipe 22A) is disposed on the central axis AX.

The spacer member 41 is formed of a material having a thermal expansion coefficient smaller than that of the flow path plate 40. A heat deformation amount of the spacer member 41 in the Z-axis direction is smaller than a heat deformation amount of the flow path plate 40. The spacer member 41 is formed of metal. The spacer member 41 is formed of, for example, stainless steel or aluminum. The spacer member 41 may be formed of ceramic. The spacer member 41 may be formed of, for example, alumina or zirconia. The spacer member 41 may be formed of carbon or fiber reinforced plastic. The spacer member 41 includes a columnar body 41B, and columnar projection portions 41C projecting upward and downward from the body 41B, respectively. The diameter of the body 41B is larger than the diameter of a projection portion 41C. A step portion 51 is formed at the boundary between the body 41B and the projection portion 41C. The step portion 51 includes a support surface 51S parallel to the XY plane.

At least a part of the body 41B is disposed in a recess 45 provided in the back surface 40B of the flow path plate 40. The projection portion 41C is inserted into a hole 46 connected to the recess 45. The hole 46 is a through hole connecting the end face of the recess 45 and the front surface 40A. The diameter of the recess 45 is larger than the diameter of the hole 46. A step portion 52 is formed at the boundary between the recess 45 and the hole 46. The step portion 52 includes a contact surface 52S parallel to the XY plane.

The shape of the step portion 51 provided in the spacer member 41 and the shape of the step portion 52 provided in the flow path plate 40 substantially match. The projection portion 41C is inserted into the hole 46, and at least a part of the body 41B is disposed in the recess 45 so that the support surface 51S and the contact surface 52S come into contact with each other. As a result, the relative position of the flow path plate 40 and the spacer member 41 in the Z-axis direction is fixed. The projection portion 41C is inserted into the hole 46, and at least a part of the body 41B is disposed in the recess 45 so that the outer surface of the projection portion 41C and the inner surface of the hole 46 come into contact with each other, and the outer surface of the body 41B and the inner surface of the recess 45 come into contact with each other. As a result, the relative position of the flow path plate 40 and the spacer member 41 in the XY plane is fixed.

At least a part of the projection portion 41C projecting upward from the body 41B projects upward from the front surface 40A of one flow path plate 40. At least a part of the projection portion 41C projecting downward from the body 41B projects downward from the front surface 40A of the other flow path plate 40.

The projection portion 41C includes a support surface 41A projecting from the front surface 40A of the flow path plate 40. The support surface 41A of the projection portion 41C projecting upward from the body 41B is disposed in the +Z side from the front surface 40A of one flow path plate 40. The support surface 41A of the projection portion 41C projecting downward from the body 41B is disposed in the −Z side from the front surface 40A of the other flow path plate 40.

The heat transfer plate 11 is supported by the support surface 41A of the spacer member 41.

As described above, the flow path groove 42 is provided in a spiral shape. The flow path groove 42 is provided on the front surface 40A of the flow path plate 40. The flow path groove 42 is formed in a center portion of the front surface 40A. A plurality of the spacer members 41 are provided so as to surround the flow path groove 42. In the embodiment, eight spacer members 41 are provided around the flow path groove 42.

The main body 10 includes a seal member 47 that seals the boundary between the front surface 40A of the flow path plate 40 and the heat transfer plate 11. The seal member 47 includes, for example, an O-ring. The seal member 47 is disposed around the flow path groove 42 on the front surface 40A. The spacer member 41 is connected to the flow path plate 40 in the outside of the seal member 47. That is, the spacer member 41 is disposed outside of the seal member 47 in the radial direction of the central axis AX.

A seal groove 48 in which the seal member 47 is disposed is provided around the flow path groove 42. The seal member 47 is in contact with the heat transfer plate 11 facing the flow path groove 42 in a state in which the seal member 47 is disposed in the seal groove 48.

<Assembly Method>

Next, an assembly method of the main body 10 according to the embodiment will be described. The projection portion 41C of the spacer member 41 is inserted into the hole 46. The projection portion 41C is inserted into the hole 46 so that the support surface 41A projects from the front surface 40A. The projection portion 41C is inserted into the hole 46 so that at least a part of the body 41B is disposed in the recess 45. The projection portion 41C is inserted into the hole 46, and at least a part of the body 41B is inserted into the recess 45 so that the support surface 51S comes into contact with the contact surface 52S, the outer surface of the projection portion 41C and the inner surface of the hole 46 come into contact with each other, and the outer surface of the body 41B and the inner surface of the recess 45 come into contact with each other. As a result, the relative position of the flow path plate 40 and the spacer member 41 is fixed in each of the six directions of the X-axis, Y-axis, Z-axis, θX, θY, and θZ directions.

After the seal member 47 is disposed in the seal groove 48, the heat transfer plate 11 is disposed so as to cover the flow path groove 42. The support surface 41A of the spacer member 41 projects from the front surface 40A of the flow path plate 40. Therefore, the heat transfer plate 11 is in contact with the support surface 41A of the spacer member 41. The heat transfer plate 11 is supported by the spacer member 41. The heat transfer plate 11 is in contact with the seal member 47. As a result, the flow path 20 is formed between the heat transfer plate 11 and the flow path plate 40.

<Operation>

Next, an operation of the temperature adjustment device 3 according to the embodiment will be described. The liquid LQ is supplied to the flow path groove 42 (the flow path 20) via the supply pipe 21, and the fluid supply port 43. The liquid LQ flows toward the fluid discharge port 44 while being guided by the flow path groove 42. In the embodiment, the flow path groove 42 has a spiral shape. The liquid LQ supplied from the fluid supply port 43 to the flow path groove 42 flows in a direction indicated by each of an arrow a, an arrow b, an arrow c, an arrow d, an arrow e, an arrow f, an arrow g, an arrow h, and an arrow i illustrated in FIG. 5, and then is discharged from the fluid discharge port 44.

When the potential difference is applied to the thermoelectric module 30, the temperature adjustment device 3 starts to adjust the temperature of the liquid LQ flowing through the flow path groove 42. The temperature of the liquid LQ flowing through the flow path groove 42 is adjusted by the thermoelectric module 30 absorbing or generating heat.

The seal member 47 seals the boundary between the front surface 40A and the heat transfer plate 11 in the outside of the flow path groove 42. Therefore, the leakage of the liquid LQ from the main body 10 is suppressed.

The liquid LQ flowing through the flow path groove 42 is discharged through the fluid discharge port 44. In the embodiment, at least a part of the fluid discharge port 44 is disposed on the central axis AX of the flow path plate 40. At least a part of the inflow port 22C of the discharge pipe 22 is also disposed on the central axis AX. That is, in the XY plane, a position of the fluid discharge port 44 provided in the flow path plate 40 and a position of the inflow port 22C provided in the discharge pipe 22 coincide with each other. Therefore, the occurrence of stagnation when the liquid LQ is discharged from the flow path groove 42 to the discharge pipe 22 is suppressed.

<Action>

Figure 7:
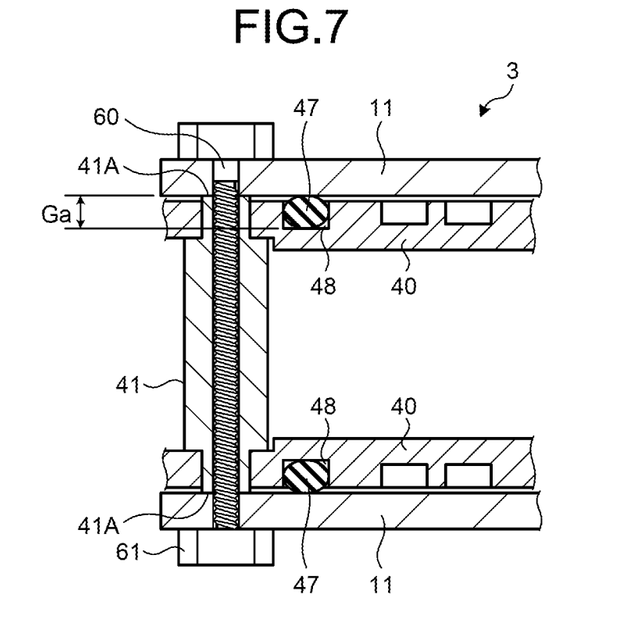
FIG. 7 is a view for describing an operation of a spacer member according to the first embodiment.

Next, an effect of the spacer member 41 according to the embodiment will be described. FIG. 7 is a view for describing an action of a spacer member 41 according to the first embodiment. In the example illustrated in FIG. 7, a pair of the heat transfer plates 11 and a pair of the flow path plates 40 are fixed by a bolt 60 and a nut 61. The spacer member 41 is disposed around a shaft of the bolt 60.

At least a part of the spacer member 41 is disposed between a pair of the flow path plates 40, and a pair of the heat transfer plates 11 is supported by the support surface 41A of the spacer member 41. As a result, when a load is applied to a pair of the heat transfer plates 11, the load is applied to the spacer member 41. As described above, as a material forming the spacer member 41, at least one of a metal such as stainless steel or aluminum, a ceramic such as alumina or zirconia, carbon, and a fiber reinforced plastic is exemplified. The flow path plate 40 is formed of a synthetic resin containing fluorine such as PTFE or PFA. A heat deformation amount of the spacer member 41 in the Z-axis direction is smaller than a heat deformation amount of the flow path plate 40. Even when a load is applied to a pair of the heat transfer plates 11, creep deformation of the spacer member 41 is suppressed. Therefore, a distance Ga between a bottom surface of the seal groove 48 in which the seal member 47 is disposed and a facing surface of the heat transfer plate 11 facing the flow path plate 40 in the Z-axis direction is maintained. By maintaining the distance Ga at a constant value, an amount in which the seal member 47 is crushed is maintained at a constant amount. Therefore, a sealing performance of the seal member 47 is maintained.

Figure 8:
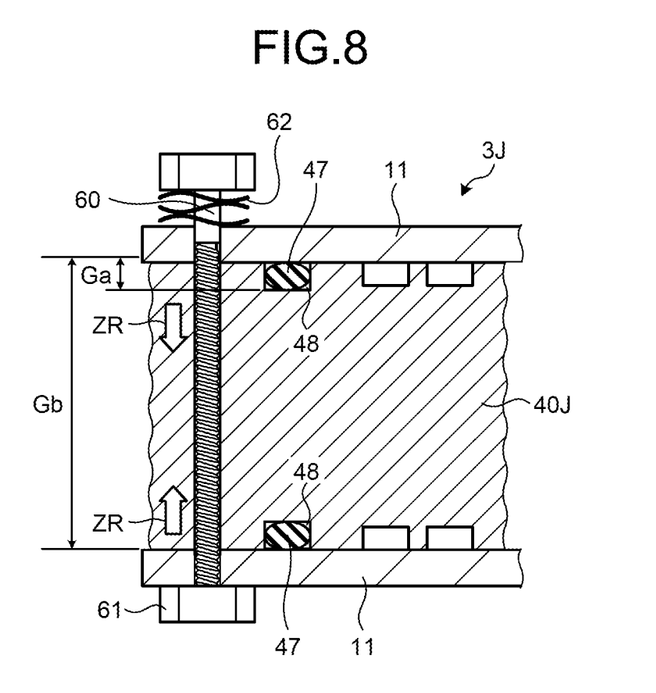
FIG. 8 is a schematic view illustrating a part of a temperature adjustment device according to a comparative example.

FIG. 8 is a schematic view illustrating a part of a temperature adjustment device 3J according to a comparative example. In the example illustrated in FIG. 8, the temperature adjustment device 3J does not include the spacer member (41). A flow path plate 40J is disposed between a pair of the heat transfer plates 11. The flow path plate 40J is formed of a synthetic resin containing fluorine such as PTFE or PFA. A pair of the heat transfer plates 11 and the flow path plate 40J are fixed by a bolt 60 and a nut 61. The temperature adjustment device 3J includes a disc spring 62 disposed between a head portion of the bolt 60 and heat transfer plate 11 so as to maintain a distance Ga between a bottom surface of the seal groove 48 in which the seal member 47 is disposed and a facing surface of the heat transfer plate 11 facing the flow path plate 40J in the Z-axis direction. However, in the temperature adjustment device 3J illustrated in FIG. 8, when a load is applied to a pair of the heat transfer plates 11, there is no spacer member (41). Therefore, there is a high possibility that creep deformation of the flow path plate 40J occurs in the Z-axis direction as indicated by an arrow ZR, and a dimension Gb of the flow path plate 40J in the Z-axis direction is changed. As a result, there is a possibility that the distance Ga may be changed and the sealing performance of the seal member 47 is not be maintained.

According to the embodiment, by disposing the spacer member 41, even when the load is applied to a pair of the heat transfer plates 11, the change of the distance Ga is suppressed. Therefore, the sealing performance of the seal member 47 is maintained. Accordingly, the liquid LQ flowing through the flow path groove 42 is prevented from leaking from the main body 10.

<Effect>

As described above, according to the embodiment, the spacer member 41 is disposed between a pair of the flow path plates 40. A heat deformation amount of the spacer member 41 in the Z-axis direction is smaller than a heat deformation amount of the flow path plate 40. Therefore, the relative position (a relative distance) between one flow path plate 40 and the other flow path plate 40 in the Z-axis direction is maintained. The heat transfer plate 11 is supported by the support surface 41A of the spacer member 41. Therefore, the relative position (a relative distance) between one heat transfer plate 11 and the other heat transfer plate 11 in the Z-axis direction is maintained. The main body 10 in which the relative position of a pair of the flow path plates 40 is maintained can be assembled only by inserting the projection portion 41C of the spacer member 41 into the hole 46 of the flow path plate 40. Therefore, when the temperature adjustment device 3 is configured of a plurality of members including a pair of the flow path plates 40 and a pair of the heat transfer plates 11, the assembly work is easy and the relative position of the plurality of members can be maintained.

The seal member 47 that seals the boundary between the front surface 40A of the flow path plate 40 and the heat transfer plate 11 is provided. Therefore, the liquid LQ flowing through the flow path groove 42 is prevented from leaking from the main body 10.

The flow path groove 42 is provided on the front surface 40A of the flow path plate 40. The seal member 47 is disposed around the flow path groove 42 on the front surface 40A. The spacer member 41 is connected to the flow path plate 40 in the outside of the seal member 47. Therefore, the liquid LQ flowing through the flow path groove 42 is prevented from leaking from the main body 10, and the contact between the spacer member 41 and the liquid LQ is suppressed. Since the contact between the spacer member 41 and the liquid LQ is suppressed, thermal deformation of the spacer member 41 due to the temperature of the liquid LQ is suppressed.

A plurality of the spacer members 41 are provided so as to surround the flow path groove 42. As a result, not only the relative position of a pair of the flow path plates 40 in the Z-axis direction but also the relative position of a pair of the flow path plates 40 in the XY plane are maintained.

At least a part of the supply pipe 21 is disposed in the space SP between one flow path plate 40 and the other flow path plate 40. As a result, the increase in size of the temperature adjustment device 3 is suppressed. The supply pipe 21 can evenly distribute the liquid LQ to each of one flow path plate 40 and the other flow path plate 40.

At least a part of the discharge pipe 22 is disposed in the space SP between one flow path plate 40 and the other flow path plate 40. As a result, the increase in size of the temperature adjustment device 3 is suppressed. The discharge pipe 22 can evenly accommodate the liquid LQ discharged from each of one flow path plate 40 and the other flow path plate 40.

At least a part of the fluid discharge port 44 of the flow path plate 40 is disposed on the central axis AX. At least a part of the inflow port 22C of the discharge pipe 22 is also disposed on the central axis AX. That is, the fluid discharge port 44 and at least a part of the inflow port 22C overlap with each other in the XY plane. Therefore, the liquid LQ discharged from the fluid discharge port 44 flows into the discharge pipe 22 from the inflow port 22C without stagnation. Contamination of the liquid LQ is suppressed by suppressing the occurrence of stagnation when the liquid LQ is discharged from the flow path groove 42 to the discharge pipe 22.

The fluid supply port 43 is disposed outside of the fluid discharge port 44 in a radial direction of the central axis AX. The flow path groove 42 is provided in a spiral shape so as to connect the fluid supply port 43 and the fluid discharge port 44. Therefore, it is possible to increase the distance between the fluid supply port 43 and the fluid discharge port 44, which is a portion in which the temperature of the liquid LQ is adjusted while suppressing the increase in size of the temperature adjustment device 3. The temperature of the liquid LQ is adjusted with high accuracy by increasing the length of the portion in which the temperature of the liquid LQ is adjusted.

Second Embodiment

The second embodiment will be described. In the following description, the same components as in the above-described embodiment are denoted by the same reference numerals, and the description thereof will be simplified or omitted.

Figure 9:
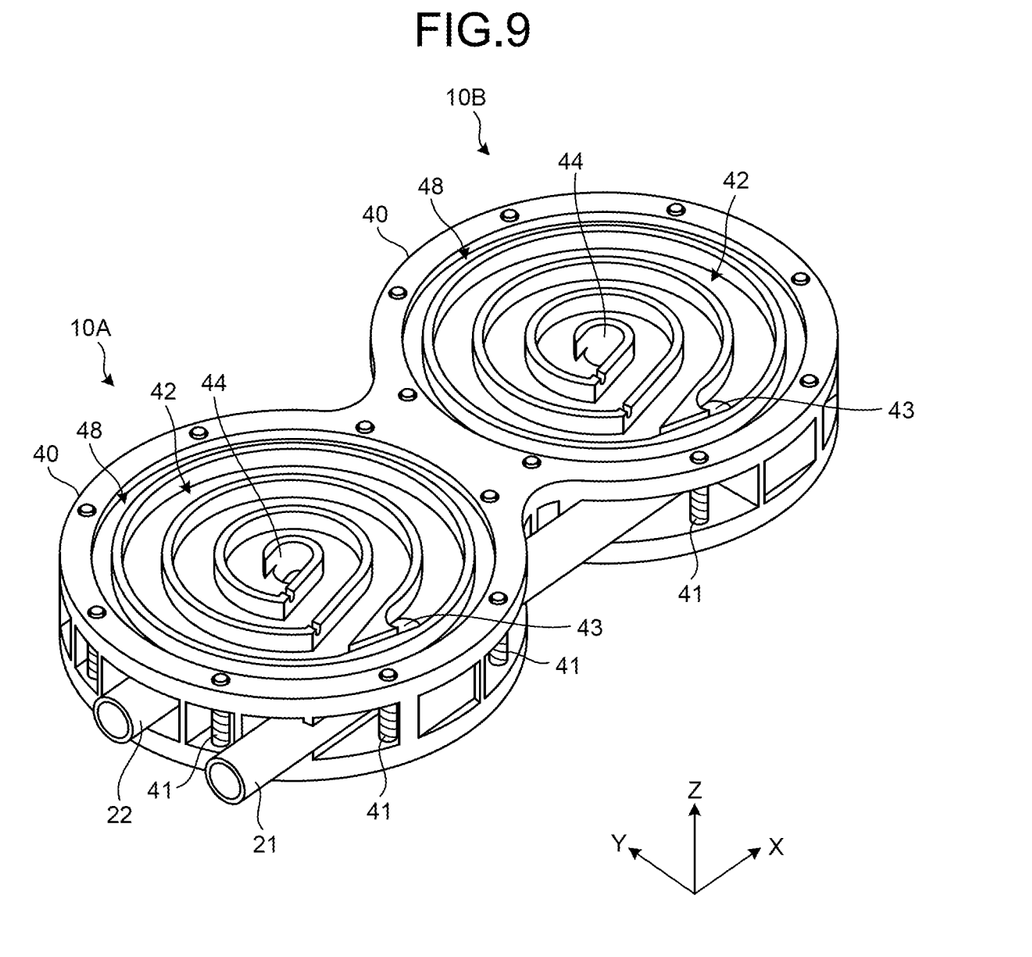
FIG. 9 is a perspective view illustrating an example of a main body of a temperature adjustment device according to a second embodiment.

FIG. 9 is a perspective view illustrating an example of a main body 10 of a temperature adjustment device 3 according to the embodiment. As illustrated in FIG. 9, the main body 10 includes a first main body 10A, and a second main body 10B connected to the first main body 10A. A structure of each of the first main body 10A and the second main body 10B is the same as that of the main body 10 according to the above-described embodiment. A heat transfer plate 11, a thermoelectric module plate 12, and a heat exchange plate 13 as described in the above-described embodiment are connected to each of the first main body 10A and the second main body 10B.

A supply pipe 21 is connected to each of a fluid supply port 43 of the first main body 10A and a fluid supply port 43 of the second main body 10B. A liquid LQ flowing through a supply pipe 21 is distributed to each of the fluid supply port 43 of the first main body 10A and the fluid supply port 43 of the second main body 10B.

The liquid LQ flowing through a flow path groove 42 of the first main body 10A is discharged to a discharge pipe 22 through a fluid discharge port 44. The liquid LQ flowing through the flow path groove 42 of the second main body 10B is discharged to the discharge pipe 22 through the fluid discharge port 44. The liquid LQ discharged from each of the fluid discharge port 44 of the first main body 10A and the fluid discharge port 44 of the second main body 10B is collected in the discharge pipe 22 and then supplied to a nozzle 5.

As described above, the temperature adjustment device 3 may include the first main body 10A, and the second main body 10B. Accordingly, for example, even in a situation where a large amount of the liquid LQ is required for cleaning a substrate W, the temperature adjustment device 3 can supply a large amount of the liquid LQ of which the temperature is adjusted to the substrate W.

Other Embodiments

In the above-described embodiment, the temperature adjustment device 3 adjusts the temperature of the liquid LQ. The temperature adjustment device 3 may adjust a temperature of a gas. By supplying the gas to the flow path groove 42, the temperature adjustment device 3 can adjust the temperature of the gas flowing through the flow path groove 42 by using the thermoelectric semiconductor element 32.

The invention claimed is:

1. A temperature adjustment device comprising:
a pair of flow path plates, each of the pair of flow path plates having (i) a first surface that defines a flow path groove and (ii) a second surface opposite to the first surface, wherein the second surfaces of the pair of flow path plates face each other;
a spacer that extends between the pair of flow path plates and connects the pair of flow path plates to each other, the spacer comprising a projection portion that passes through the first and second surfaces of each of the pair of flow path plates; and
a heat transfer plate that is supported by the projection portion and faces the flow path groove.

2. The temperature adjustment device according to claim 1, further comprising a seal that seals a gap between the first surface and the heat transfer plate.

3. The temperature adjustment device according to claim 2, wherein:
the seal is disposed around the flow path groove on the first surface; and
the spacer is connected to the pair of flow path plates and disposed at an outside of the seal.

4. The temperature adjustment device according to claim 3, wherein each of the pair of flow path plates defines a plurality of the spacers that include the spacer and surround the flow path groove.

5. The temperature adjustment device according to claim 1, further comprising a supply pipe disposed between the pair of flow path plates and configured to supply a fluid to the flow path groove.

6. The temperature adjustment device according to claim 1, further comprising a discharge pipe disposed between the pair of flow path plates and configured to discharge a fluid from the flow path groove.

7. The temperature adjustment device according to claim 6, wherein each of the pair of flow path plates further defines a fluid discharge port at a central axis of the pair of flow path plates, and
wherein at least a part of an inflow port of the discharge pipe is disposed at the central axis.

8. The temperature adjustment device according to claim 7, wherein each of the pair of flow path plates further defines a fluid supply port disposed outside of the fluid discharge port in a radial direction of the central axis, and
wherein the flow path groove has a spiral shape connecting the fluid supply port to the fluid discharge port.

9. The temperature adjustment device according to claim 1, wherein the spacer has a columnar shape extending through the pair of flow path plates.

10. The temperature adjustment device according to claim 1, wherein the projection portion defines a support surface that protrudes toward the heat transfer plate through the first surface of one of the pair of flow path plates and supports the heat transfer plate.

11. The temperature adjustment device according to claim 1, wherein the pair of flow path plates are disposed along a horizontal plane, and
wherein the spacer has a columnar shape extending through the pair of flow path plates in a vertical direction that is orthogonal to the horizontal plane.

* * * * *